United States Patent [19]

Gass

[11] 4,203,074

[45] May 13, 1980

[54] POTENTIOMETER CIRCUIT

[75] Inventor: Ernst Gass, Stuttgart, Fed. Rep. of Germany

[73] Assignee: Waters Manufacturing, Inc., Wayland, Mass.

[21] Appl. No.: 770,428

[22] Filed: Feb. 22, 1977

[51] Int. Cl.[2] .......................... H03K 3/00; G01P 3/42

[52] U.S. Cl. .................................... 308/181; 307/228; 324/176

[58] Field of Search ............... 324/176, 62 R; 323/79; 307/228, 354; 328/181, 1, 5

[56] References Cited

U.S. PATENT DOCUMENTS

| | | | |
|---|---|---|---|
| 2,959,729 | 11/1960 | Karg | 323/79 |
| 3,749,939 | 7/1973 | Kuijk et al. | 307/228 |
| 3,875,501 | 4/1975 | Hayashi | 324/62 R |
| 3,876,933 | 4/1975 | Herrington | 324/62 R |

*Primary Examiner*—Stanley D. Miller, Jr

*Assistant Examiner*—B. P. Davis

[57] ABSTRACT

A potentiometer circuit by which a continuous, sawtooth 360 degree ramp output voltage is obtained from a single turn continuous rotation potentiometer having an annularly disposed resistance element and two angularly displaced rotatable wipers providing displaced voltages from the resistance element. The circuit includes comparator means responsive to one of the wiper voltages providing a comparator output signal and switch means responsive to the comparator output signal for switching between the wiper voltage outputs to provide a continuous, sawtooth 360 degree ramp analog output voltage. An analog-digital converter may be connected to it to provide a digital output voltage.

12 Claims, 7 Drawing Figures

FIG I

FIG 5
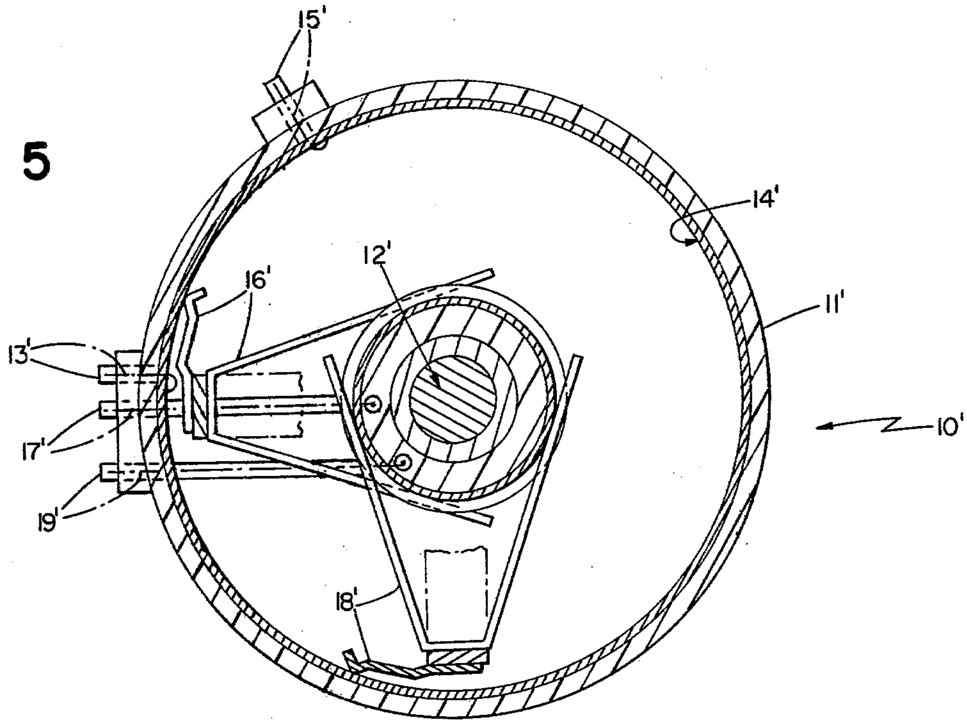
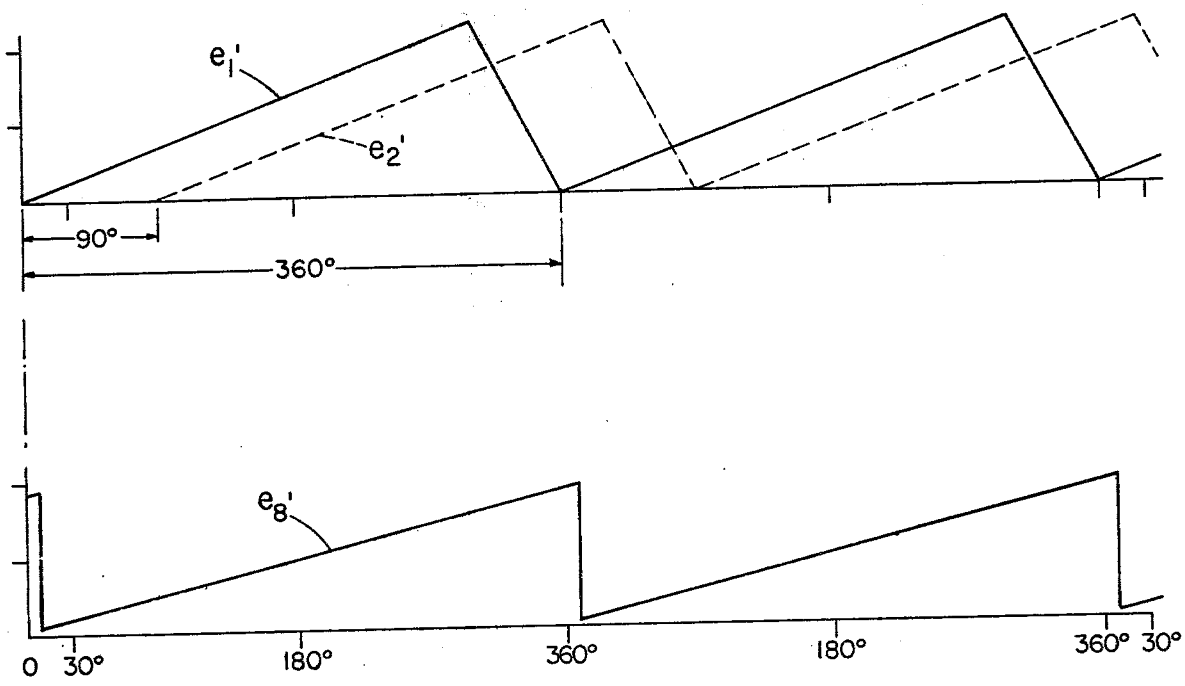
FIG 6

POTENTIOMETER CIRCUIT

FIELD OF THE INVENTION

This invention relates to potentiometer circuits and, more particularly, to such circuits in which a 360 degree sawtooth ramp output voltage is obtained from a single turn, continuous rotation potentiometer, to enable its use as a 360 degree analog or digital encoder, for example.

BACKGROUND OF THE INVENTION

A conventional 360 degree, single turn, continuous rotation potentiometer cannot effectively be used as a 360 degree analog or digital encoder because the terminals on the resistance element necessarily produce a discontinuity, either because the connections at the ends of the resistance element and the necessary insulation between them limits the function angle to something less than 360 degrees or because the spaced terminals on a continuous resistance element produce a double sloped rather than a ramp sawtooth voltage. Attempts have heretofore been made to solve this problem by utilizing a dual potentiometer structure, as disclosed in U.S. Pat. Nos. 3,850,604 and 2,959,729, for example. However, such devices have not proved to be satisfactory because of complications introduced by the potentiometer structure and the difficulty of adjusting it to provide the desired 360 degree output.

SUMMARY OF THE INVENTION

It is a major object of the invention to provide a novel potentiometer circuit by which a continuous, sawtooth 360 degree ramp output voltage is obtained from a single turn, continuous rotation potentiometer to enable its use as a 360 degree analog or digital encoder.

It is another object of the invention to provide such a circuit which may be easily adjusted to compensate for the production variations in the potentiometer to which it is connected.

According to the invention, these and still other objects of the invention are achieved by a novel circuit providing a continuous sawtooth ramp voltage output from two displaced, overlapped sawtooth voltage inputs. The circuit preferably includes switching initiation voltage means responsive to one of the sawtooth voltage inputs providing a switching initiation voltage of greater and lesser value than that of the same sawtooth voltage input,. Comparator means responsive to such greater or lesser value of the switching initiation voltage provides a comparator output signal. Switch means responsive to the comparator output signal switches the voltage inputs to provide the continous sawtooth ramp voltage output. This novel circuit may be utilized to provide a potentiometer circuit by which a 360 degree voltage output is obtained from a single turn, continuous rotation potentiometer by providing such a potentiometer with an annularly disposed resistance element having a discontinuity between the terminals thereof, and with two angularly displaced, radially disposed, rotatable wipers providing overlapped displaced sawtooth voltage inputs from the resistance element. The comparator means is responsive to one of the wiper voltage inputs and provides a comparator output signal. Switch means responsive to the comparator output signal is provided for switching between the wiper voltage inputs to provide the 360 degree sawtooth ramp analog voltage output. There may also be included electrical phasing adjustment means compensating for errors in the angular adjustment of the wipers. Also, an analog-digital converter may be connected to the circuit to provide a digital output voltage.

BRIEF DESCRIPTION OF THE DRAWINGS

For the purpose of fully explaining the above and still further objects and features of the invention, reference is now made to the following detailed description of a preferred embodiment of the invention, together with the accompanying drawings, wherein:

FIG. 5 is an end sectional view of an alternative single turn, continuous rotation, dual wiper potentiometer for use with the circuit of FIG. 1;

FIG. 6 is a timing diagram of certain voltages related to the potentiometer of FIG. 5.

DETAILED DESCRIPTION

Figure 1:
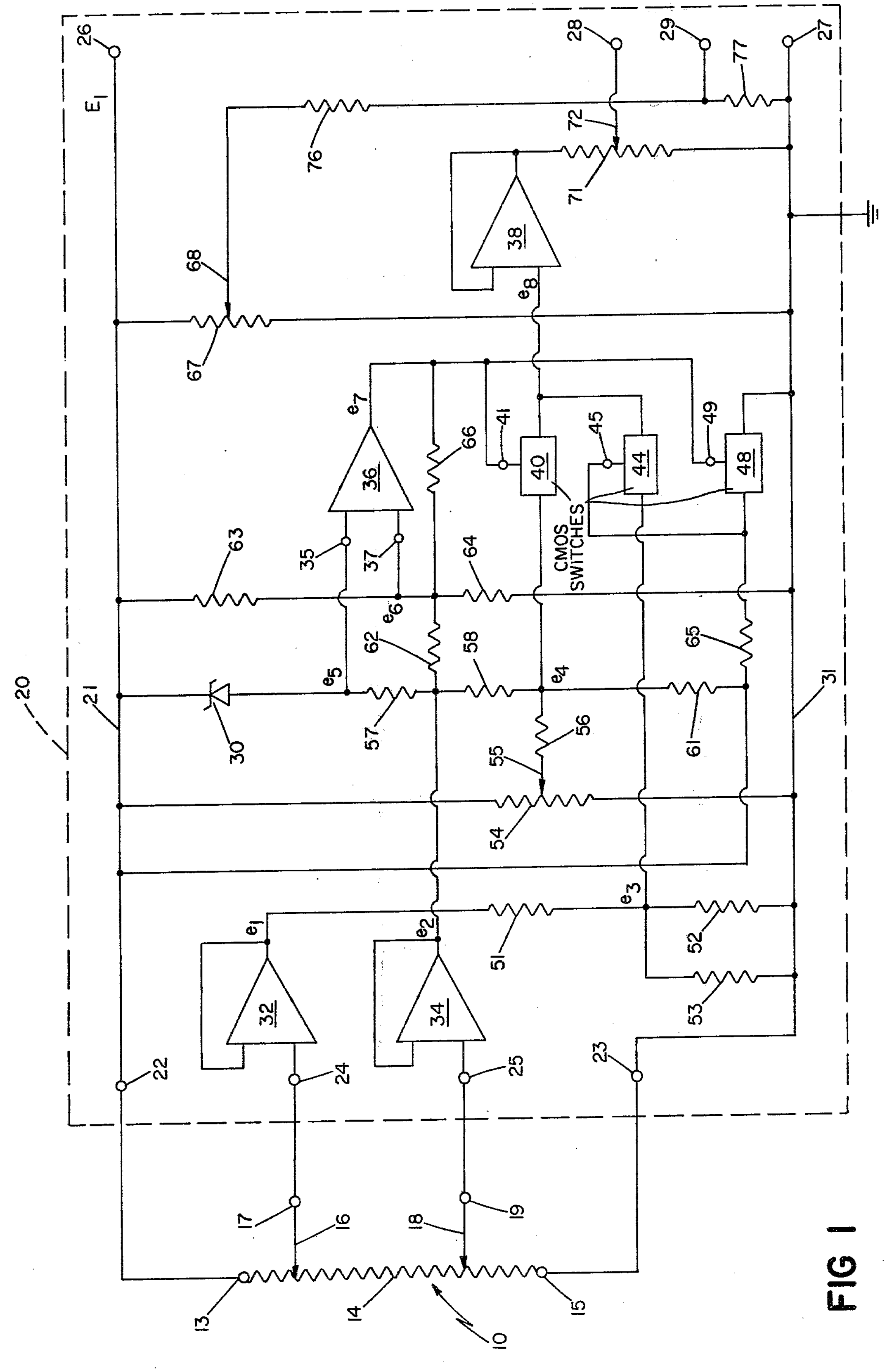
FIG. 1 is a circuit diagram of the potentiometer circuit of the invention.
Figure 7:
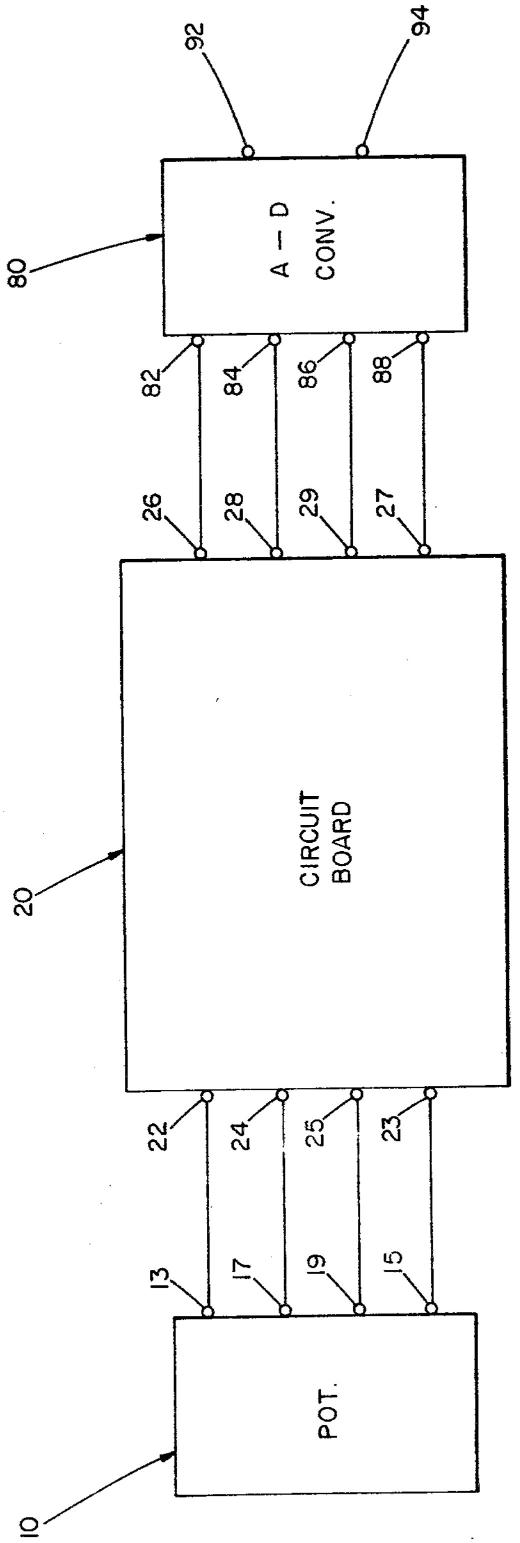
FIG. 7 is a block diagram of the potentiometer circuit of the invention with an analog-digital converter connected to it.

Referring to the drawings, and particularly to FIGS. 1 and 7 thereof, the potentiometer circuit of the invention, by which a 360 degree analog or digital continuous linear sawtooth ramp output voltage of uniform slope is obtained from a single turn, continuous rotation, dual wiper potentiometer, is shown therein, mounted on a circuit board 20, indicated in dotted lines, and connected to a dual wiper potentiometer, generally designated 10, which may be remotely located. An analog-digital converter 80, such as a Siliconix LD 130, may be connected to its output to provide a digital voltage output.

Figure 2:
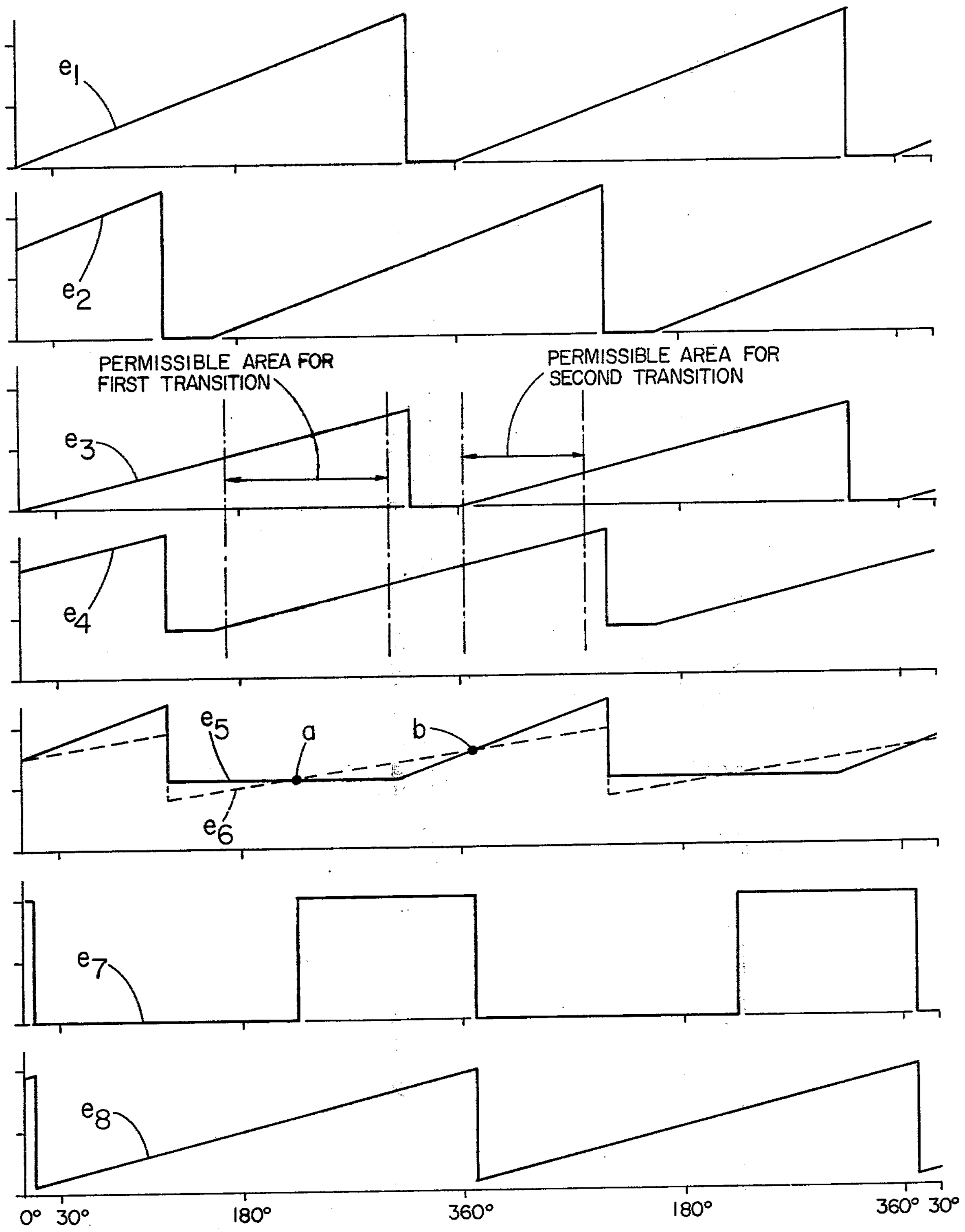
FIG. 2 is a timing diagram of certain voltages during operation of the circuit of FIG. 1.
Figure 3:
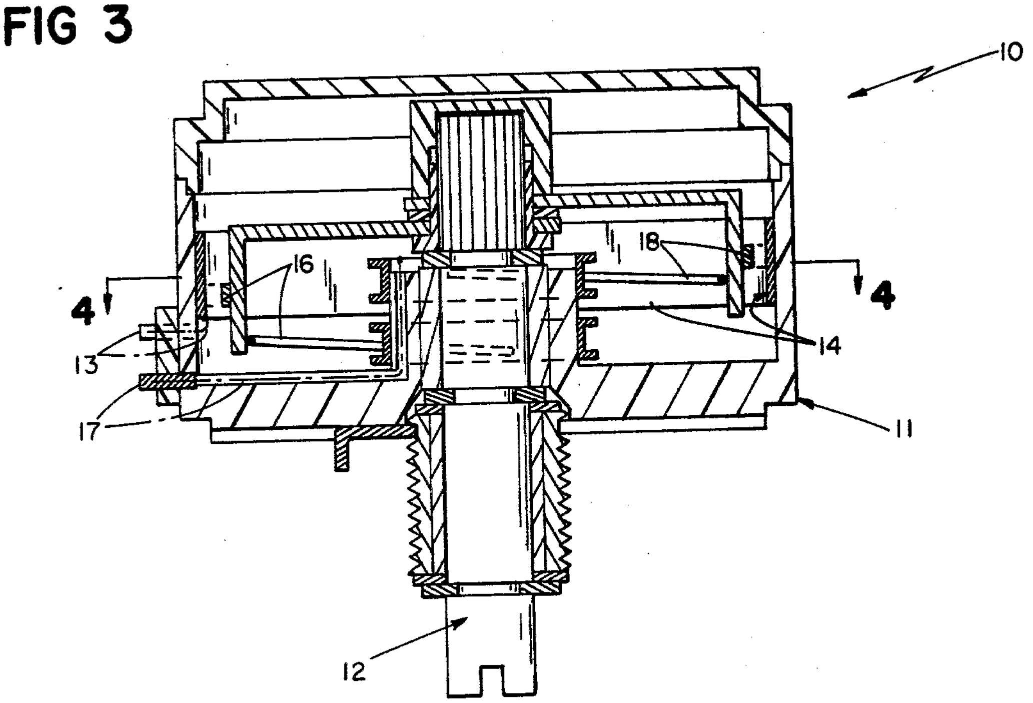
FIGS. 3 and 4 are, respectively, side and end sectional views of a single turn, continuous rotation, dual wiper potentiometer for use with the circuit of FIG. 1.
Figure 4:
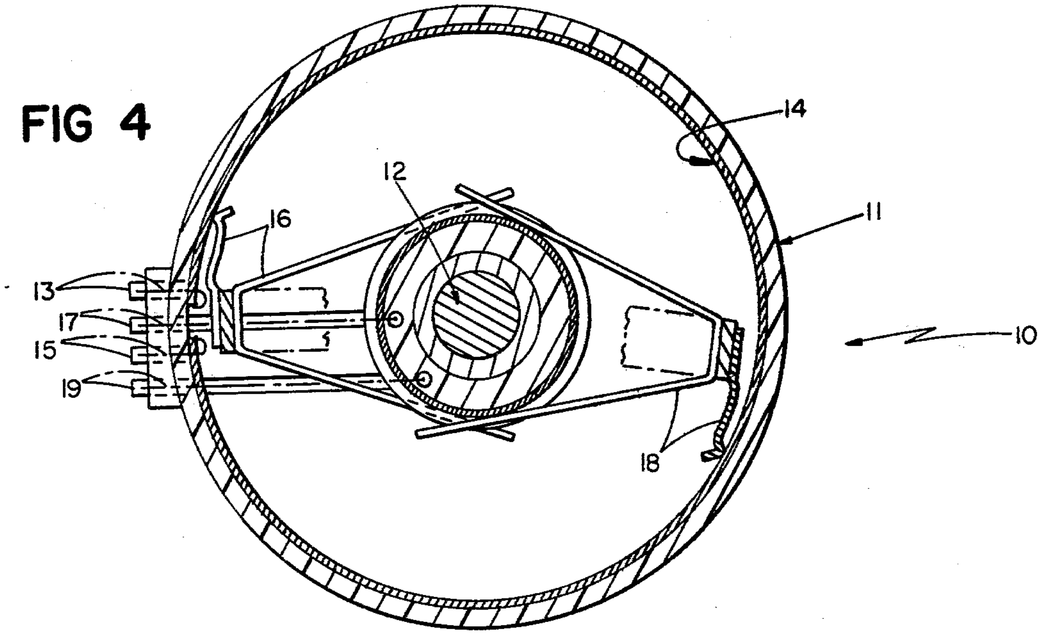

As shown in FIGS. 3 and 4, the potentiometer 10 has, mounted within its body 11, a conventional annularly disposed resistance element 14 of slightly less than 360 degrees, thereby providing a discontinuity in the form of a dead space sector between the end terminals 13 and 15 thereof. Mounted on potentiometer shaft 12 for rotation in unison are two angularly displaced radially disposed rotatable wipers 16 and 18, providing two angularly displaced, overlapped, discontinuous, sawtooth, ramp voltage inputs from resistance element 14 at wiper terminals 17 and 19, respectively, herein shown as 192 degrees out of phase. The input voltages $e_1$ and $e_2$ from wipers 16 and 18, respectively, will occur as shown in FIG. 2 upon rotation of potentiometer shaft 12. Herein, a sawtooth ramp voltage is defined as a voltage which drops instantaneously from a maximum to a minimum, as do voltages $e_1$, $e_2$ and $e_8$ of FIG. 2.

An alternative potentiometer structure is shown in FIG. 5, wherein the potentiometer 10' has, mounted within its body 11', a conventional annularly disposed continuous resistance element 14 with angularly spaced terminals 13' and 15', thereby providing a discontinuity between the terminals 13' and 15' thereof. Mounted on potentiometer shaft 12' for rotation in unison are two angularly displaced radially disposed rotatable wipers 16' and 18', providing two angularly displaced, overlapped, continuous, double sloped voltage inputs from resistance element 14′ at wiper terminals 17′ and 19′, respectively, herein shown as 90 degrees out of phase. The input voltges $e_1'$ and $e_2'$ from wipers 16′ and 18′, respectively, will occur as shown in FIG. 6 upon rotation of potentiometer shaft 12′, producing double sloped sawtooth voltages, in which the voltage drop is not instantaneous.

Potentiometer 10 (or 10′) is connected to circuit board 20 by connecting its supply voltage terminal 13 and ground terminal 15 to corresponding terminals 22 and 23, respectively, on circuit board 20 and by connecting its wiper terminals 16 and 18 to signal voltage input terminals 24 and 25, respectively, on circuit board 20. Circuit board 20 is also provided with a supply voltage input terminal 26, connected to terminal 22 by a suitable wire 21 at a supply voltage $E_1$, a ground terminal 27, connected to terminal 23 of a suitable ground wire 31 at a voltage $E_0$, and signal voltage output terminals 28 and 29.

On circuit board 20 is mounted a Zener diode 30, such as an IN5235, a comparator and three operational amplifiers 32, 34, 36 and 38, such a Raytheon 3403, three solid state switches 40, 44 and 48, such as an RCA 4016 CMOS, and a plurality of ressitors and trimmer potentiometers as will be hereafter explained in connection with the operation of the circuit.

The circuit and its operation can best be described in connection with FIG. 2, which is a timing diagram of various voltages $e_1, \ldots e_8$, the locations of which are shown on FIG. 1. Thus, the two displaced, overlapped, discontinous, linear sawtooth ramp voltages (or with potentiometer 10′, the continuous double sloped voltages having a linear portion) are input from wipers 16 and 18 at terminals 24 and 25 are introduced to the inputs of operational amplifiers 32 and 34, functioning as unity gain followers, to provide similar voltage inputs $e_1$ and $e_2$ as shown in FIG. 2. The voltage input from each wiper is reproduced exactly at the outputs of its associated operational amplifier since they present essentially no loading to the potentiometer wiper voltages, but they can drive the voltage $e_1$ and $e_2$ network of resistors 51 and 52 and 58 and 61, respectively, with no loss or alteration of either voltage $e_1$ or $e_2$.

The voltage $e_3$, associated with wiper 16, is simply a fixed fraction of the voltage $e_1$, established by the voltage divider action of resistors 51 and 52.

Similarly, the voltage $e_4$ is a fraction of voltage $e_2$, as established by the resistors 58 and 61. In addition, however, voltage $e_4$ contains a constant component which is a fraction of the supply voltage $E_1$, so that voltage $e_4$ is of different voltage level from that of voltage $e_3$. Such constant component can also be provided by suitable taps on resistance element 14 or 14′ of potentiometer 10 or 10′. If the ratio of resistor 51 to resistor 52 is exactly equal to the ratio of resistor 58 to resistor 61, then the voltages $e_3$ and $e_4$, which are displaced, overlapped, discontinuous ramp voltages of different voltage level derived from wipers 16 and 18, will have exactly equal linear slopes. If the mechanical angular displacement between the two wipers is also chosen appropriately for the resistance ratios, here being chosen as 162 degrees for resistance ratios of 1 to 2, then the fixed difference between voltages $e_3$ and $e_4$, which would have been produced by that angular displacement if resistor 61 had been returned to ground (as resistor 52), can be exactly cancelled by the fixed increment of voltage contributed to voltage $e_4$ by the actual connection of resistor 61 to supply voltage $E_1$ on line 31. Under such conditions, the voltages $e_3$ and $e_4$ are suitable for application to the switches, which choose between the two wiper circuits to provide the desired 360 degree sawtooth ramp voltage output.

However, the exact magnitude of the angular displacement required between the two wipers depends on the exact electrical length of the potentiometer element 14, as well as the exact value of the ratio of resistor 51 to resistor 52.

Since it is impossible as a practical matter to maintain a particular potentiometer element length within the necessary tolerances on a routine production basis, in order to avoid the concomitant adjustment to compensate for an error in the mechanical angular displacement of wipers 16 and 18 after completion of the overall assembly, an electrical "phasing" adjustment is provided. This has the further advantage of making relatively easy the necessary adjustment in the field required upon replacement of a potentiometer.

In order to accomplish this, a trim potentiometer 54, having an adjustable wiper 55 with a series resistor 56, is used to inject an adjustable small additional current through resistor 56 into the junction of resistors 58 and 61. The value of resistor 56 is large compared to resistor 61, while the value of potentiometer 54 is small compared to resistor 56. However, since resistor 56 will represent some load on the junction of resistors 58 and 61, so that the slope of the ramp voltage $e_4$ would not be quite equal to that of voltage $e_3$, resistor 53 is added as a shunt to restore the circuit symmetry.

The nominal 162 degree angular displacement between the wipers 16 and 18 is calculated on the basis of the expected voltage $e_3$ with the wiper 55 of trim potentiometer 54 at the center of its travel. The effects of production tolerances are then removed by adjusting it, when the wipers are near the point where their outputs will be switched, so that the value of voltage $e_4$ will be exactly equal to that of voltage $e_3$ at that point.

For switching the input voltages of wipers 16 and 18 as required to provide a continuous 360 degree sawtooth ramp voltage output, three CMOS switches, 40, 44 and 48 are provided. Each of switches 40, 44 and 48 is essentially an open circuit when its control terminal 41, 45 or 49, respectively, is brought down close to ground potentional, while the same switch appears as low resistance when its control terminal is brought high, close to the value of supply voltage $E_1$.

In FIG. 1, the switch 48, in conjunction with resistor 65, acts as a phase inverter so that when its comparator signal control voltage $e_7$ is high, turning switch 48 "on" ground control terminal 45 of switch 44. When its comparator signal control voltage $e_7$ is low, switch 48 is turned "off", allowing the control voltage applied to control terminal 45 of switch 44 to rise. The oppositely phased control voltages reaching the control terminals 41 and 45 of switches 40 and 44 ensure that, when switch 40 is closed, switch 44 is open, and vice-versa. Specifically, when the comparator signal control voltage $e_7$ is low, switch 44 is closed, switch 40 is open and the voltage $e_3$, derived from wiper 16, reaches the output terminal 28. Conversely, when voltage $e_7$ is high, it is the voltage $e_4$ from wiper 18 which reaches output terminal 28.

For some range of travel of the wipers, after wiper 18 has moved up from terminal 15, and before wiper 16 has reached terminal 13, the voltages $e_3$ and $e_4$ are exactly equal. At any point within this range, the control voltage $e_7$ may be driven high to produce the required transition of the output signal from wiper 16 (which will soon be reaching the end of the potentiometer element) to wiper 18, which still has a substantial length of element available to it. This transition point is shown in FIG. 2 at a on the voltage $e_5$ and $e_6$ plot. Thus, this point is not critical.

Subsequently, after wiper 16 has passed terminal 13, gone over the blank space between terminals 13 and 14, and is back on the element, but before wiper 18 has reached the end of the element at terminal 13, the control voltage $e_7$ must be driven low so that the output signal is again derived from wiper 16. This transition point is shown in FIG. 2 at b on the voltage $e_5$ and $e_6$ plot.

It is at this transition point that the sawtooth ramp output voltage $e_8$ falls suddenly. The voltage difference through which the output voltage $e_8$ falls does not depend on the exact instant in the cycle when the control voltage $e_7$ drops, but the absolute value of voltage $e_8$ at that instant does. This dependence makes the timing of the fall of the control voltage critical.

The rise and fall of the comparator signal control voltage $e_7$ at points a and b, respectively, of FIG. 2 is accomplished by a comparator 36 whose input signals are non-linear ramp voltage $e_5$ and linear ramp voltage $e_6$. Both voltages $e_5$ and $e_6$ are derived from voltage $e_2$, the output of wiper 18, by means of two networks. The first network comprises resistor 57 and Zener diode 30, while the second network comprises three fixed resistors, 62, 63, and 64.

When voltage $e_2$ is near ground potential, the full supply voltage $E_1$ is applied across the Zener diode 30 and resistor 57 in series with it. Assuming that the Zener voltage is less than supply voltage $E_1$, Zener diode 30 will break down, and the non-linear switching initiation ramp voltage $e_5$, at its terminal connected to one input terminal 35 of comparator 36, will assume a value equal to supply voltage $E_1$ minus the Zener rating. As voltage $e_2$ rises, the value of voltage $e_5$ will remain constant until the difference between voltages $E_1$ and $e_2$ equals the Zener rating. At this point the Zener stops conduction, and voltage $e_5$ will follow voltage $e_2$, with essentially no voltage drop across resistor 57. This behavior is shown in the plot of switching initiation ramp voltage $e_5$ in FIG. 2.

The linear ramp voltage $e_6$ will start and end at values established only by the stable supply voltage $E_1$, and the three fixed resistors 62, 63 and 64. The plot of voltage $e_6$, also shown in FIG. 2, is thus a straight line which, due to the loading effect of resistors 63 and 64, rises more slowly than does the voltage $e_2$.

By proper choice of the Zener voltage rating and the values of resistor 62, 63 and 64, the non-linear ramp voltage $e_5$ plot can be made to intersect the linear ramp voltage $e_6$ plot twice, so that comparator 36 input voltages $e_5$ and $e_6$ will provide two transitions shown as points a and b on FIG. 2. Before the first intersection, at point a, voltage $e_5$ is greater, i.e. more positive, than voltage $e_6$, and, since it is connected to the inverting input terminal 35 of comparator 36, the control voltage output $e_7$ of comparator 36 will be low.

After the first intersection, point a, voltage $e_6$ is more positive than voltage $e_5$, so that the control voltage output $e_7$ of comparator 36 is high; and finallly, after the second intersection, point b, voltage $e_5$ is again the more positive and voltage $e_6$ the lesser, driving the control voltage output $e_7$ low again.

The voltage of Zener diode 30 is involved in the first transition, point a, which signals the transfer of the system output from wiper 16 to wiper 18. To the extent that the Zener voltage is not precisely specified, the exact transition point will not be known. However, this uncertainty is of no significance. On the other hand, reproducibility and stability of the second transition is important, but since the steep part of the non-linear voltage $e_5$ dog leg plot which controls this second transition occurs when the Zener is no longer conducting, the Zener rating uncertainty drops out of consideration.

The resistor 66 is made very high in comparison with the paralleled value of resistors 62, 63 and 64, so that it does not significantly affect the operation of the circuit as described above. It does, however, provide regenerative feedback around the comparator 36 so that the comparator action in deciding that the intersection of the plot of voltages $e_5$ and $e_6$ has been reached will be unambiguous, and the comparator output voltage $e_7$ will go through a single clean rise and fall at the transition points. The desired continuous linear sawtooth ramp voltage output of uniform slope is voltage $e_8$ at the output of either switch 40 or switch 44, as shown in FIG. 2, covering a full 360 degrees of rotation between the vertical drops, and with no discontinuities other than those drops.

The circuit will operate in a similar manner when connected to potentiometer 10' to produce a continuous linear sawtooth ramp voltage $e_8'$ as shown in FIG. 6.

To avoid loading the switching circuits, it is preferable to buffer voltage $e_8$ from the final output terminals 28 and 29 by a high input impedance buffer amplifier. This may include an operational amplifier 38 having its output connected to a potentiometer 71 connected to ground line 31 and to negative output and ground terminals 27 and 29. Its wiper 72 is connected to output terminal 28. Output terminal 29 is lifted above ground an adjustable amount by means of the potentiometer 67 and resistors 76 and 77. The final analog output voltage is the voltage difference between terminals 28 and 29, where potentiometer 71 controls the magnitude of the sawtooth voltage, while potentiometer 67 controls its level with respect to ground.

If a digital voltage output is desired, an analog-digital converter 80, such as a Siliconix LD 180, may be connected to circuit board 20, as shown in FIG. 7, by connecting its supply voltage and ground terminals 80 and 88, respectively, to the equivalent terminals 26 and 27 of circuit board 20 and by connecting its analog voltage input terminals 84 and 86 to circuit board terminals 28 and 29. A digital output voltage, converted from the analog input voltage, will then be provided at its output terminals 92 and 94.

What is claimed is:

1. A circuit providing a continuous sawtooth ramp voltage output of uniform slope from two displaced sawtooth voltage inputs of uniform slope, said circuit comprising circuit means for bringing said sawtooth voltage inputs of uniform slope into an overlapped condition;

comparator means responsive to at least one of said voltage inputs providing a comparator output signal and switch means responsive to said comparator output signal alternately switching said voltage inputs, as modified by said circuit means, onto a single line to provide said continuous sawtooth voltage output.

2. A circuit as claimed in claim 1, wherein said continuous sawtooth voltage output is an analog voltage and further including analog-digital converter means converting said analog voltage output to a digital voltage output.

3. A circuit providing, a continuous sawtooth ramp voltage output of uniform slope from two displaced, sawtooth voltage inputs of uniform slope, said circuit comprising circuit means for bringing said sawtooth voltage inputs of uniform slope into an overlapped condition switching initiation voltage means responsive to one of said sawtooth voltage inputs providing a switching initiation voltage of greater and lesser value than that of said sawtooth voltage input comparator means responsive to said greater or lesser value of said switching initiation voltage providing a comparator output signal and switch means responsive to said comparator output signal for alternately switching said voltage inputs, as modified by said circuit means, onto a single line to provide said continuous sawtooth voltage output.

4. A circuit as claimed in claim 3 wherein said two sawtooth voltage inputs, as modified by said circuit means, are of different voltage levels.

5. For use with a single turn, continuous rotation potentiometer with an annularly disposed resistance element having a discontinuity between the terminals thereof and two angularly displaced radially disposed rotatable wipers providing displaced voltage inputs from said resistance element, a potentiometer circuit by which a continuous 360 degree sawtooth ramp voltage output is obtained from said potentiometer, said circuit comprising circuit means, for receiving said displaced voltage inputs and for bringing them into an overlapped condition comparator means, responsive to one of said wiper voltage inputs, providing a comparator output signal and switch means responsive to said comparator output signal for alternately switching said wiper voltage outputs, as modified by said circuit means, onto a single line to provide said 360° voltage output.

6. For use with a single turn, continuous rotation potentiometer with an annularly disposed resistance element having a discontinuity between the terminals thereof and two angularly displaced radially disposed rotatable wipers providing two displaced sawtooth voltage inputs from said resistance element, a potentiometer circuit by which a continuous 360 degree sawtooth ramp voltage output of uniform slope is obtained from said potentiometer, said circuit comprising circuit means for receiving said displaced sawtooth voltage inputs and for bringing them into an overlapped condition switching initiation voltage means responsive to one of said sawtooth voltage inputs alternately providing a switching initiation voltage of greater and lesser value than that of said sawtooth voltage input comparator means responsive to said greater or lesser value of said switching initiation voltage providing a comparator output signal and switch means responsive to said comparator output signal alternately switching said voltage inputs, as modified by said circuit means, onto a single line to provide said continuous sawtooth voltage output.

7. A potentiometer circuit by which a continuous 360 degree sawtooth ramp voltage output is obtained from a single turn, continuous rotation potentiometer, said circuit comprising a potentiometer with an annularly disposed resistance element having a discontinuity between the terminals thereof and two angularly displaced radially disposed rotatable wipers providing displaced voltage inputs from said resistance element comparator means responsive to one of said wiper voltage inputs providing a comparator output signal and switch means responsive to said comparator output signal for switching said wiper voltage inputs to provide said 360° voltage output.

8. A potentiometer circuit as claimed in claim 7, further including phasing adjustment means compensating for errors in the relative angular adjustment of said rotatable wipers.

9. A potentiometer circuit by which a continuous 360 degree sawtooth ramp analog voltage output of uniform slope is obtained from a single turn continuous rotation potentiometer, said circuit comprising a potentiometer with an annularly disposed resistance element having a discontinuity between the terminals thereof and two angularly displaced radially disposed rotatable wipers providing two displaced sawtooth voltage inputs from said resistance element switching initiation voltage means responsive to one of said sawtooth voltage inputs alternately providing a switching initiation voltage greater and lesser value than that of said sawtooth voltage input comparator means responsive to said greater or lesser value of said switching initiation voltage providing a comparator output signal and switch means responsive to said comparator output signal switching said input voltages to provide said continuous analog 360 degree sawtooth voltage output.

10. A potentiometer circuit as claimed in claim 9, further including analog-digital converter means converting said analog voltage output to a digital voltage output.

11. A potentiometer circuit as claimed in claim 9, wherein said potentiometer has an annularly disposed resistance element of slightly less than 360 degrees with a dead space sector between the terminals thereof providing two displaced, overlapped, discontinuous sawtooth ramp voltage inputs.

12. A potentiometer circuit as claimed in claim 9, wherein said potentiometer has an annularly disposed continuous resistance element with the terminals thereof angularly spaced providing two displaced, overlapped, continuous double sloped sawtooth voltage inputs.

* * * * *